United States Patent
Song et al.

(10) Patent No.: US 11,043,545 B2
(45) Date of Patent: Jun. 22, 2021

(54) DISPLAY SUBSTRATE, FABRICATING METHOD THEREOF, AND DISPLAY DEVICE

(71) Applicant: BOE TECHNOLOGY GROUP CO., LTD., Beijing (CN)

(72) Inventors: Zhen Song, Beijing (CN); Guoying Wang, Beijing (CN); Wei Li, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/536,942

(22) Filed: Aug. 9, 2019

(65) Prior Publication Data

US 2020/0052053 A1 Feb. 13, 2020

(30) Foreign Application Priority Data

Aug. 9, 2018 (CN) .......................... 201810902568.0

(51) Int. Cl.
*H01L 27/32* (2006.01)
*H01L 51/52* (2006.01)
*H01L 51/56* (2006.01)

(52) U.S. Cl.
CPC ...... *H01L 27/3248* (2013.01); *H01L 27/3246* (2013.01); *H01L 27/3258* (2013.01);
(Continued)

(58) Field of Classification Search
CPC ........ H01L 27/3241–27/3297; H01L 27/3248; H01L 27/3246; H01L 27/3258;
(Continued)

(56) References Cited

U.S. PATENT DOCUMENTS

| 9,362,345 B2* | 6/2016 | Jeong ................. H01L 27/3276 |
| 2005/0051776 A1* | 3/2005 | Miyagi ............... G09G 3/3233 |
| | | 257/72 |

(Continued)

FOREIGN PATENT DOCUMENTS

| CN | 1822383 A | 8/2006 |
| CN | 104637438 A | 5/2015 |

(Continued)

OTHER PUBLICATIONS

First Office Action dated Mar. 19, 2020 for corresponding Chinese application 201810902568.0.

*Primary Examiner* — Jonathan Han
(74) *Attorney, Agent, or Firm* — Nath, Goldberg & Meyer; Joshua B. Goldberg (57) ABSTRACT

The present disclosure provides a display substrate, a fabricating method thereof, and a display device. The display substrate includes a substrate; at least one pixel on a side of the substrate, the at least one pixel comprising a driving transistor, the driving transistor comprising a drain; an insulating layer on a side of the driving transistor away from the substrate, the insulating layer covering the driving transistor and having a first via hole opposite to the drain; an auxiliary conductive structure on a side of the insulating layer away from the substrate, and the auxiliary conductive structure connected to the drain through the first via hole; and a first planarization layer on a side of the auxiliary conductive structure away from the substrate, and having a second via hole disposed therein.

18 Claims, 5 Drawing Sheets

(52) U.S. Cl.
CPC ...... *H01L 27/3262* (2013.01); *H01L 27/3265* (2013.01); *H01L 51/5212* (2013.01); *H01L 51/5218* (2013.01); *H01L 51/56* (2013.01); *H01L 2227/323* (2013.01); *H01L 2251/5315* (2013.01)

(58) Field of Classification Search
CPC ............. H01L 27/3262; H01L 27/3265; H01L 51/5212; H01L 51/5218; H01L 51/56; H01L 2227/323; H01L 2251/5315
USPC .......................................................... 257/40
See application file for complete search history.

(56) References Cited

U.S. PATENT DOCUMENTS

| | | |
|---|---|---|
| 2015/0123098 A1 | 5/2015 | Kang |
| 2016/0071919 A1 | 3/2016 | Chen |
| 2017/0125506 A1* | 5/2017 | Kim ................... H01L 27/3265 |
| 2017/0221762 A1* | 8/2017 | Cai ..................... H01L 27/3248 |
| 2018/0047799 A1 | 2/2018 | Lim et al. |
| 2018/0175127 A1 | 6/2018 | Lee et al. |

FOREIGN PATENT DOCUMENTS

| | | |
|---|---|---|
| CN | 107731144 A | 2/2018 |
| CN | 108206192 A | 6/2018 |

\* cited by examiner

DISPLAY SUBSTRATE, FABRICATING METHOD THEREOF, AND DISPLAY DEVICE

TECHNICAL FIELD

The present disclosure relates to display technology, more particularly, to a display substrate, a fabricating method thereof, and a display device.

BACKGROUND

At present, an organic light emitting display device formed by an active-matrix organic light emitting diode (AMOLED) has excellent characteristics in power consumption and image, and therefore, the organic light emitting display device is applied more and more widely.

SUMMARY

According to an aspect of the present disclosure, there is provided a display substrate including a substrate; at least one pixel on a side of the substrate, the at least one pixel comprising a driving transistor, the driving transistor comprising a drain; an insulating layer on a side of the driving transistor away from the substrate, the insulating layer covering the driving transistor and having a first via hole opposite to the drain; an auxiliary conductive structure on a side of the insulating layer away from the substrate, and the auxiliary conductive structure connected to the drain through the first via hole; and a first planarization layer on a side of the auxiliary conductive structure away from the substrate, and having a second via hole disposed therein, wherein the at least one pixel comprises a light emitting region and a non-light emitting region surrounding the light emitting region; the driving transistor and the first via hole are in the light emitting region, and the second via hole is in the non-light emitting region.

According to some embodiments of the present disclosure, the display substrate further includes: a first electrode on a side of the first planarization layer away from the substrate and located in the light emitting region, wherein the first electrode is connected to the auxiliary conductive structure through the second via hole.

According to some embodiments of the present disclosure, the first electrode is a reflective conductive layer.

According to some embodiments of the present disclosure, an orthographic projection of the auxiliary conductive structure on the substrate overlaps with an orthographic projection of the first via hole and the second via hole on the substrate.

According to some embodiments of the present disclosure, the display substrate further includes a second planarization layer between the auxiliary conductive structure and the insulating layer.

According to some embodiments of the present disclosure, the display substrate further includes: an electrode layer in a same layer as a source of the driving transistor and the drain and cover by the insulating layer, and the electrode layer being connected to a gate of the drive transistor, wherein an orthographic projection of the auxiliary conductive structure on the substrate at least partially overlaps with an orthographic projection of the electrode layer on the substrate to form a first capacitor.

According to some embodiments of the present disclosure, an active layer of the driving transistor includes a non-conductor region and a conductor region, wherein an orthographic projection of the non-conductor region on the substrate overlaps with an orthographic projection of the gate on the substrate, the drain is connected to the conductor region, and an orthographic projection of the conductor region on the substrate at least partially overlaps with the orthographic projection of the electrode layer on the substrate to form a second capacitor.

According to some embodiments of the present disclosure, the gate is disposed on a side of the active layer away from the substrate, and a gate insulating layer is disposed between the gate and the active layer.

According to some embodiments of the present disclosure, the display substrate further includes a pixel defining layer on the reflective conductive layer, wherein the light emitting region is defined by an opening of the pixel defining layer.

According to another aspect of the present disclosure, there is provided a method of fabricating a display substrate, including: forming a source and a drain of a driving transistor; forming an insulating layer on the source and the drain, the insulating layer covering the source and the drain and having a first via hole disposed therein; forming an auxiliary conductive structure on the insulating layer, the auxiliary conductive structure being connected to the drain through the first via hole; forming a first planarization layer on the auxiliary conductive structure, the first planarization layer having a second via hole disposed therein; and forming a light emitting diode on the first planarization layer, the light emitting diode being connected to the auxiliary conductive structure through the second via hole.

According to some embodiments of the present disclosure, forming the light emitting diode includes: forming a first electrode on the first planarization layer; forming a pixel defining layer on the reflective conductive layer; forming an opening in the pixel defining layer, the opening corresponding to a light emitting region; and forming a light emitting layer and a second electrode sequentially disposed on the first electrode at the opening, wherein the first electrode is connected to the auxiliary conductive structure through the second via hole.

According to some embodiments of the present disclosure, the method further includes forming a second planarization layer on the insulating layer.

According to some embodiments of the present disclosure, the method further includes forming an electrode layer and a gate of the driving transistor, wherein the electrode layer is formed in a same layer as the source and the drain, and the electrode layer is connected to the gate.

According to some embodiments of the present disclosure, the method further includes forming an active layer on the substrate before forming the source and the drain, wherein the active layer includes a non-conductor region and a conductor region, an orthographic projection of the non-conductor region on the substrate overlaps with an orthographic projection of the gate on the substrate, and the source and the drain are respectively connected to the conductor region.

According to another aspect of the present disclosure, there is provided a display device including a display substrate according to the present disclosure.

DETAILED DESCRIPTION

The present disclosure will be further described in detail below in conjunction with the accompanying drawings and embodiments, and thus the technical solutions of the present disclosure will be better understood by those skilled in the art. It is noted that the following description of some embodiments has been presented for purposes of illustration and description. It is not intended to be exhaustive or to limit the precise forms disclosed, and the same part is omitted in order to avoid redundancy.

In the present application, the phrase "disposed in a same layer" means that two elements are formed of the same material layer, that is, they are in the same layer in a laminated relationship, but this does not mean that they are away from the substrate by a same distance and does not mean that there is a same structure between those elements and the substrate.

In the present application, the term "patterning process" refers to a process of forming a structure having a specific pattern, for example, a photolithography process including one or more of forming a material layer, coating a photoresist, exposing, developing, etching, resist stripping, etc. It can be understood that the "patterning process" may also be other processes such as an imprint process, an inkjet printing process, and the like.

Figure 1A:
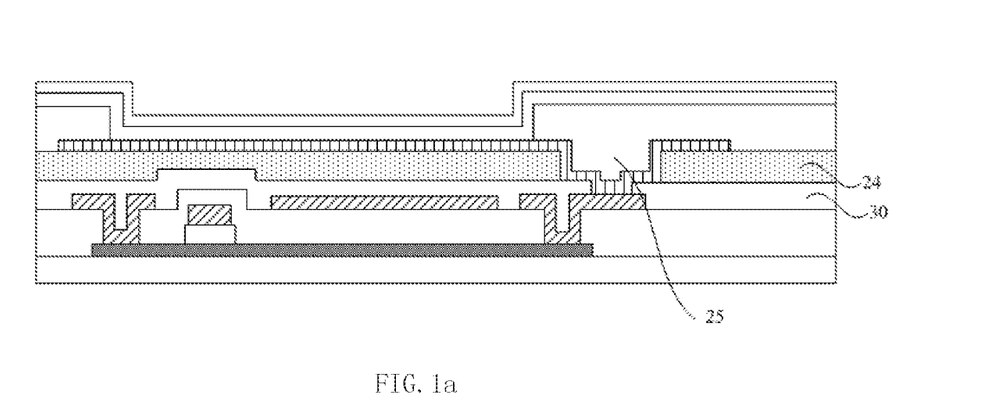
FIG. 1a is a cross-sectional structural view of an organic light emitting display substrate.
Figure 1B:
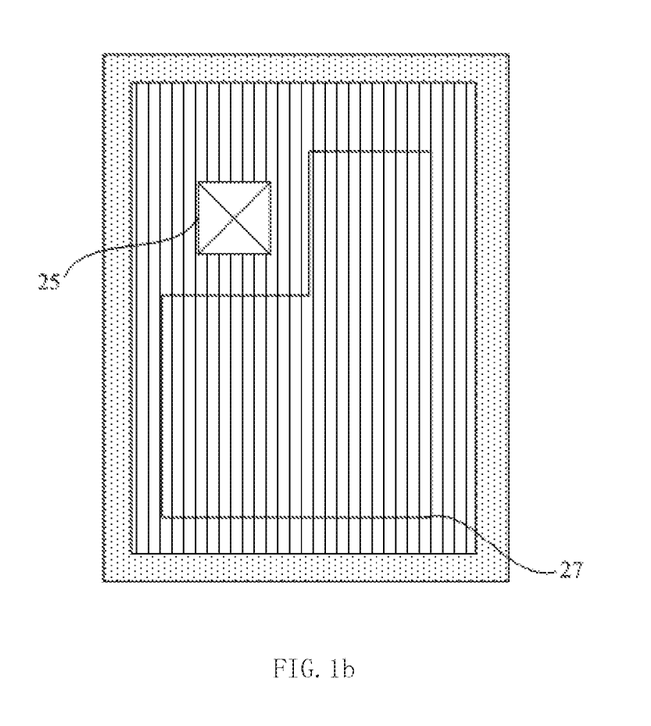
FIG. 1b is a top plan view of an organic light emitting display substrate.

FIG. 1a is a cross-sectional structural view of an organic light emitting display substrate, and FIG. 1b is a top view of an organic light emitting display substrate. As shown in FIG. 1a and FIG. 1b, the organic light emitting display substrate includes a thin film transistor and a light emitting structure (e.g., an organic light emitting diode). A dielectric layer 30 and a planarization layer 24 are disposed between the thin film transistor and the light emitting structure, and a first electrode of the light emitting structure is connected to a drain of the thin film transistor through a via hole 25 in the dielectric layer 30 and the planarization layer 24. Since an upper surface of the planarization layer 24 is not flat at the via hole 25, a light emitting region cannot be disposed at the via hole 25 of the planarization layer 24 and in the vicinity of the via hole 25, that is, the light emitting region of the organic light emitting display substrate covers only a part of the thin film transistor (for example, cannot cover the drain of the thin film transistor) to keep away from the via hole 25 in the planarization layer 24, which limits the light emitting area of the organic light emitting display device, thereby reducing a brightness of the organic light emitting display device.

The present disclosure provides an organic light emitting display substrate, a fabricating method thereof, and an organic light emitting display device that substantially obviate one or more of the problems due to limitations and disadvantages of the related art. In the present disclosure, by providing a first planarization layer, a first via hole, and a second via hole, and disposing a driving transistor and the first via hole in a light emitting region and the second via hole in a non-light emitting region, a ratio of the area of the light emitting region to the area of the organic light emitting display substrate can be increased, thereby enhancing a brightness of the organic light emitting display device and improving performance of the organic light emitting display substrate.

According to some embodiments of the present disclosure, the organic light emitting display substrate includes: a substrate, a driving transistor disposed on the substrate, and an organic light emitting diode disposed on a side of the driving transistor away from the substrate, wherein the organic light emitting display substrate further includes: an insulating layer covering a source and a drain of the driving transistor and having a first via hole disposed therein; an auxiliary conductive structure disposed on a side of the insulating layer away from the substrate and connected to the drain through the first via hole; and a first planarization layer disposed on a side of the auxiliary conductive structure away from the substrate, and having a second via hole disposed therein, wherein the organic light emitting diode is disposed in a light emitting region and connected to the auxiliary conductive structure through the second via hole, the driving transistor and the first via hole are disposed in the light emitting region, and the second via hole is disposed in a non-light emitting region.

Figure 2A:
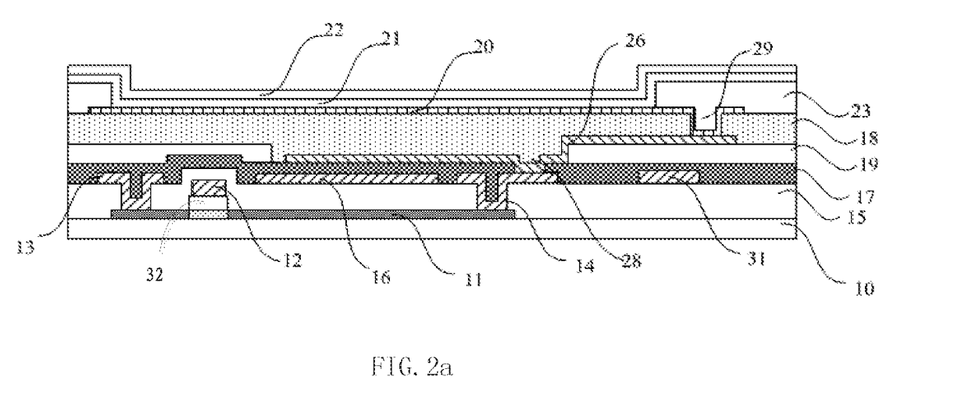
FIG. 2a is a cross-sectional structural view of an organic light emitting display substrate according to some embodiments of the present disclosure.
Figure 2B:
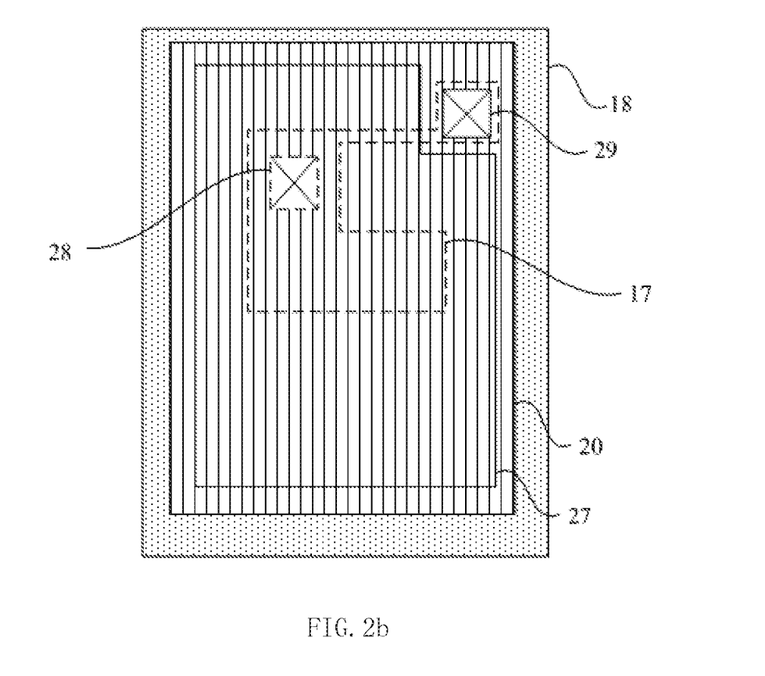
FIG. 2b is a top plan view of an organic light emitting display substrate according to some embodiments of the present disclosure.

FIG. 2a is a cross-sectional structural view of an organic light emitting display substrate according to some embodiments of the present disclosure, and FIG. 2b is a top view of an organic light emitting display substrate according to some embodiments of the present disclosure. Referring to FIGS. 2a and 2b, in some embodiments, an organic light emitting display substrate includes: a substrate 10, a driving transistor disposed on the substrate 10, and an organic light emitting diode disposed on the driving transistor away from the substrate 10, wherein the organic light emitting diode is located in a light emitting region 27, and a region outside the light emitting region 27 is a non-light emitting region. As shown in FIG. 2a, the organic light emitting display substrate further includes: an insulating layer 17 covering a source 13 and a drain 14 of the driving transistor; an auxiliary conductive structure 26 disposed on a side of the insulating layer 17 away from the substrate 10 and having a first via hole 28 disposed therein, wherein the auxiliary conductive structure 26 is connected to the drain 14 through the first via hole 28; a first planarization layer 18 disposed on a side of the auxiliary conductive structure 26 away from the substrate 10 and having a second via hole 29 disposed therein, the organic light emitting diode is connected to the auxiliary conductive structure 26 through the second via hole 29, wherein the driving transistor and the first via hole 28 are disposed in the light emitting region 27, and the second via hole 29 is disposed in the non-light emitting region. A lead 31 may be provided between the first via hole 28 and the second via hole 29, and disposed in the same layer as the drain 14.

In the present application, in order to keep away from the lead 31 (e.g., a data line or the like) or other structures (e.g., other transistors), the driving transistor is electrically connected with the organic light emitting diode by the auxiliary conductive structure 26 disposed between the driving transistor and the organic light emitting diode, in particular, the auxiliary conductive structure 26 is electrically connected with the driving transistor (e.g., the drain 14 of the driving transistor) through the first via hole 28 in the insulating layer 17 disposed under the auxiliary conductive structure 26, and the auxiliary conductive structure 26 is electrically connected with the organic light emitting diode (e.g., a first electrode of the organic light emitting diode) through the second via hole 29 in the first planarization layer 18 disposed on the auxiliary conductive structure 26. Since the second via hole 29 in the first planarization layer 18 may be disposed at a position (where is originally used as the non-light emitting region for setting the lead 31 or the like, for example, for providing a spacer) away from the driving transistor and the first via hole 28, the driving transistor and the first via hole 28 can be disposed in the light emitting region 27 of the organic light emitting diode, and the ratio of the area of the light emitting region 27 to the area of the entire organic light emitting display substrate can be increased, thereby enhancing the brightness of the light emitting display device and improving the performance of the organic light emitting display substrate.

Referring again to FIG. 2a, in some embodiments, the organic light emitting display substrate may further include a reflective conductive layer 20 disposed on a side of the first planarization layer 18 away from the substrate 10, wherein the reflective conductive layer 20 located in the light emitting region 27 may be used as the first electrode of the organic light emitting diode, and the reflective conductive layer 20 is electrically connected to the auxiliary conductive structure 26 through the second via hole 29. In some embodiments, the reflective conductive layer 20 is disposed on the first planarization layer 18 and in the second via hole 29, the reflective conductive layer 20 located in the light emitting region 27 may be used as the first electrode of the organic light emitting diode (e.g., the anode), the reflective conductive layer 20 located in the second via hole 29 is electrically connected to the auxiliary conductive structure 26, thereby achieving electrical connection of the organic light emitting diode with the auxiliary conductive structure 26.

In some embodiments, the reflective conductive layer 20 is reflective and may reflect light emitted by the organic light emitting diode to a side away from the substrate 10, thereby preventing the light from affecting the driving transistor. That is, the organic light emitting display substrate according to some embodiments of the present disclosure is a top emission type organic light emitting display substrate.

A portion of the reflective conductive layer 20 that is not used as the first electrode may be used to connect the second via hole 29 with the first electrode, thereby allowing the position of the second via hole 29 to be changed. Therefore, the arrangement of the reflective conductive layer 20 can not only satisfy the basic requirements for achieving the basic performance of the organic light emitting display substrate, but also cooperate with the second via hole 29 to increase the area of the light emitting region 27.

In some embodiments, the organic light emitting display substrate may further include an electrode layer 16 disposed in the same layer as the source 13 and the drain 14. The electrode layer 16 is electrically connected to a gate 12 of the driving transistor, an orthographic projection of the auxiliary conductive structure 26 on the substrate 10 at least partially overlaps an orthographic projection of the electrode layer 16 on the substrate 10, such that the electrode layer 16 and the auxiliary conductive structure 26 form a first capacitor. In some embodiments, the electrode layer 16 and the auxiliary conductive structure 26 located in the light emitting region 27 form the first capacitor for storing capacitance. The electrical connection of the electrode layer 16 to the gate 12 may avoid floating of the electrode layer 16, ensuring the effectiveness of the storage capacitor formed by the electrode layer 16 and a portion of the auxiliary conductive structure 26 located in the light emitting region 27.

In some embodiments, an active layer 11 of the driving transistor may include a non-conductor region and a conductor region. An orthographic projection of the non-conductor region on the substrate 10 overlaps with an orthographic projection of the gate 12 on the substrate 10, the source 13 and the drain 14 are respectively connected to the conductor region, and an orthographic projection of the conductor region on the substrate 10 at least partly overlaps with the orthographic projection of the electrode layer 16 on the substrate 10 to form a second capacitor. In some embodiments, the non-conductor region may have a property of semiconductor, that is, the non-conductor region may be conductive under certain conditions. The conductor region may have a property of conductor, that is, it can conduct electricity. The non-conductor region and the conductor region are connected to each other to constitute an integral active layer 11. Herein, the second capacitor is formed of the electrode layer 16 and a portion of the conductor region that is opposite to the electrode layer 16, so that a final storage capacitor is a laminated capacitor formed of the electrode layer 16 and the auxiliary conductive structure 26 and the conductor region that are opposite to the electrode layer 16. The laminated capacitor not only reduces a space occupied by the second capacitor, but also increases the capacity of the second capacitor, thereby improving the performance of the organic light emitting display substrate.

In some embodiments, the organic light emitting display substrate may further include a second planarization layer 19 between the auxiliary conductive structure 26 and the insulating layer 17 and at least at the second via hole 29. Wherein, the second planarization layer 19 is disposed on the insulating layer 17, and a portion of the auxiliary conductive structure 26 located in the non-light emitting region may be located on the second planarization layer 19. Further, a portion of the second planarization layer 19 may also be located in the light emitting region 27.

The second planarization layer 19 may raise the position at which the auxiliary conductive structure 26 is connected to the light-reflective conductive layer 20, so that the depth of the second via hole 29 in the first planarization layer 18 is reduced, which reduces the difficulty of the fabricating process. Further, when a portion of the second planarization layer 19 is located in the light emitting region 27, since the first planarization layer 18 and the second planarization layer 19 are present in the light emitting region 27, flatness of layers in the light emitting region 27 can be further enhanced, and light is emitted more uniformly.

In some embodiments, the gate 12 of the driving transistor may be disposed on a side of the active layer 11 away from the substrate 10, and a gate insulating layer 32 may be disposed between the gate 12 and the active layer 11. In some embodiments, the drive transistor is a transistor having a top gate structure. Compared with a transistor having a bottom gate structure, the top gate structure may not only reduce the fabricating steps of the organic light emitting display substrate, but also reduce an entire thickness of the organic light emitting display substrate.

According to another aspect of the present disclosure, there is provided a method of fabricating an organic light emitting display substrate. In some embodiments, the method includes: forming a source and a drain of a driving transistor; forming an insulating layer on the source and the drain, the insulating layer covering the source and the drain and having a first via hole disposed therein; forming an auxiliary conductive structure on the insulating layer, the auxiliary conductive structure being connected to the drain through the first via hole; forming a first planarization layer on the auxiliary conductive structure, the first planarization layer having a second via hole disposed therein; and forming an organic light emitting diode on the first planarization layer, the organic light emitting diode being connected to the auxiliary conductive structure through the second via hole.

In some embodiments, the step of forming the organic light emitting diode includes: forming a reflective conductive layer on the first planarization layer, forming a pixel defining layer on the reflective conductive layer; forming an opening in the pixel defining layer, the opening corresponding to a light emitting region; and forming an organic light emitting layer and a second electrode sequentially disposed on the reflective conductive layer at the opening, wherein the reflective conductive layer is used as a first electrode of the organic light emitting diode, and is connected to the auxiliary conductive structure through the second via hole.

In some embodiments, the method further includes forming a second planarization layer on the insulating layer.

In some embodiments, the method further includes: forming an electrode layer and a gate of the driving transistor, wherein the electrode layer is formed in a same layer as the source and the drain, and the electrode layer is connected to the gate.

In some embodiments, the method further includes forming an active layer on the substrate before forming the source and the drain, wherein the active layer includes a non-conductor region and a conductor region, an orthographic projection of the non-conductor region on the substrate overlaps with an orthographic projection of the gate on the substrate, and the source and the drain are respectively connected to the conductor region.

In some embodiments, the gate is disposed on the active layer, and a gate insulating layer is disposed between the gate and the active layer.

Figure 3:
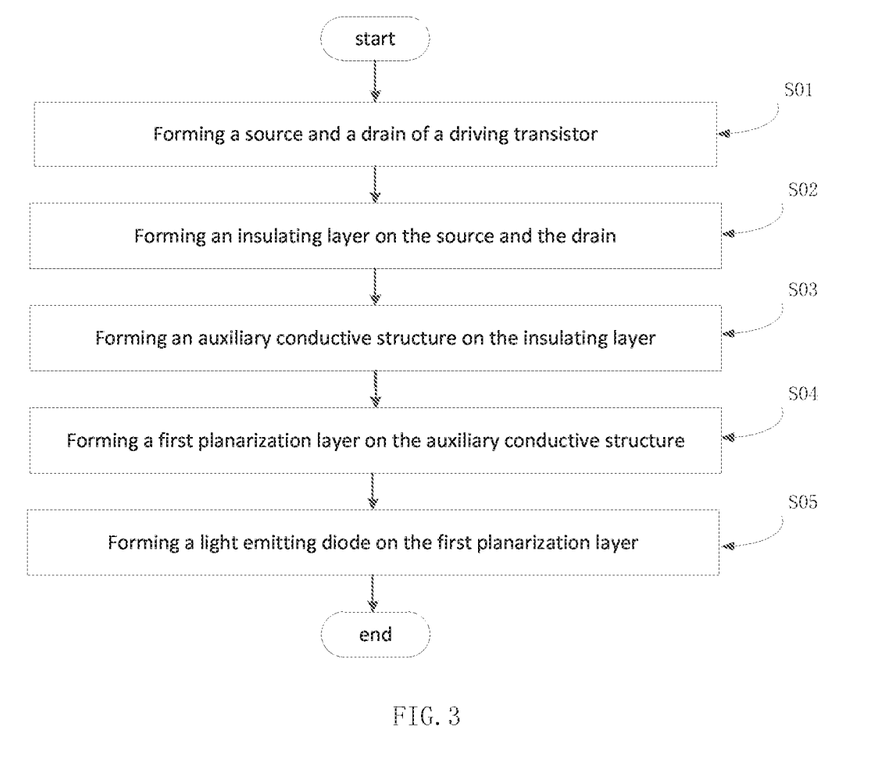
FIG. 3 is a flow chart of a method of fabricating an organic light emitting display substrate according to some embodiments of the present disclosure.

FIG. 3 is a flow chart of a method of fabricating an organic light emitting display substrate according to some embodiments of the present disclosure, and FIGS. 4a to 4d are cross-sectional views corresponding to respective steps of a method of fabricating an organic light emitting display substrate according to some embodiments of the present disclosure.

Figure 4A:
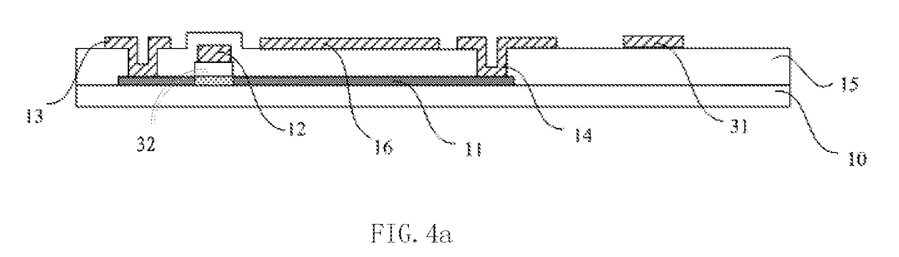
FIGS. 4a to 4e are cross-sectional views corresponding to respective steps of a method of fabricating an organic light emitting display substrate according to some embodiments of the present disclosure.

Referring to FIG. 3 and FIG. 4a, in step S01, a source 13 and a drain 14 of a driving transistor are formed by using a patterning process. In some embodiments, an electrode layer 16 and a gate 12 of the drive transistor are formed while forming the source 13 and the drain 14.

In some embodiments, before forming the source 13 and the drain 14, an active layer 11 is formed according to a predetermined pattern. The active layer 11 includes a non-conductor region and a conductor region. The active layer 11 may be formed of an organic semiconductor, an oxidized semiconductor, or the like, and may include, for example, a-IGZO, IZTO, a-Si, p-Si, hexathiophene, polythiophene, or the like. In some embodiments, the conductor region is formed by making a semiconductor material to be conductive by a special process such that the conductor region of the active layer 11 forms a capacitor with the electrode layer 16.

In some embodiments, a gate insulating layer 32 is formed on the non-conductor region of the active layer 11. The gate insulating layer 32 may be formed of an insulating material such as an oxide or a nitride. In some embodiments, the gate 12 is formed on the gate insulating layer. The gate insulating layer 32 separates the gate 12 from the active layer 11. The gate 12 may be formed of a highly conductive material such as metal. In some embodiments, the drive transistor is a top gate structure.

Referring again to FIG. 4a, in some embodiments, an interlayer dielectric layer 15 covering the gate 12, the gate insulating layer 32, and the active layer 11 is formed, and via holes are formed in the interlayer dielectric layer 15, such that upper surfaces of two separate regions of the active layer 11 are exposed. The interlayer dielectric layer 15 may include a material having a planarization effect such as a silicone-based material, an acrylic-based material, a polyimide-based material, or the like.

In some embodiments, the source 13, the drain 14, the electrode layer 16, and leads 31 are formed on a side of the interlayer dielectric layer 15 away from a substrate 10. In some embodiments, a conductive layer is formed on the interlayer dielectric layer 15 and in the via hole such that the conductive layer covers an upper surface of the interlayer dielectric layer 15, bottom surfaces and side surfaces of the via holes. Portions of the conductive layer are then removed according to a predetermined pattern to form the source 13, the drain 14, the electrode layer 16, and the leads 31 as shown in FIG. 4a.

Figure 4B:
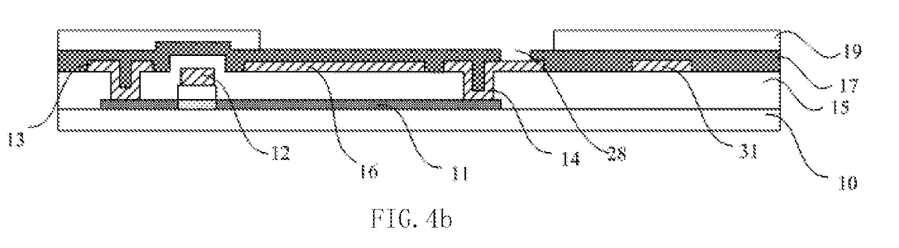

Referring to FIG. 3 and FIG. 4b, in step S02, an insulating layer 17 is formed on the source 13 and the drain 14. The insulating layer 17 covers the source 13, the drain 14 and the electrode layers 16, and a first via hole 28 is provided in the insulating layer 17. As shown in FIG. 4b, in some embodiments, a second planarization layer 19 is formed on the insulating layer 17.

In some embodiments, the source 13, the drain 14, the electrode layer 16, and the lead 31 are located in a same layer, and the insulating layer 17 is formed on a side of the same layer away from the substrate 10. The insulating layer 17 separates the source 13, the drain electrode 14, the electrode layer 16, and the leads 31 from each other, and the insulating layer 17 covers the source electrode 13, the drain electrode 14, the electrode layer 16, and the leads 31. Then, the first via hole 28 is formed in the insulating layer 17 according to a predetermined pattern, so that the drain 14 is exposed through the first via hole 28. In some embodiments, the insulating layer 17 may be formed of an insulating material such as an oxide, a nitride, or the like.

As shown in FIG. 4b, in some embodiments, a planarization material layer is formed on the insulating layer 17, and an opening is formed in the planarization material layer according to a predetermined pattern to form the second planarization layer 19. In some embodiments, the second planarization layer 19 does not cover the first via hole 28 in the insulating layer 17.

Figure 4C:
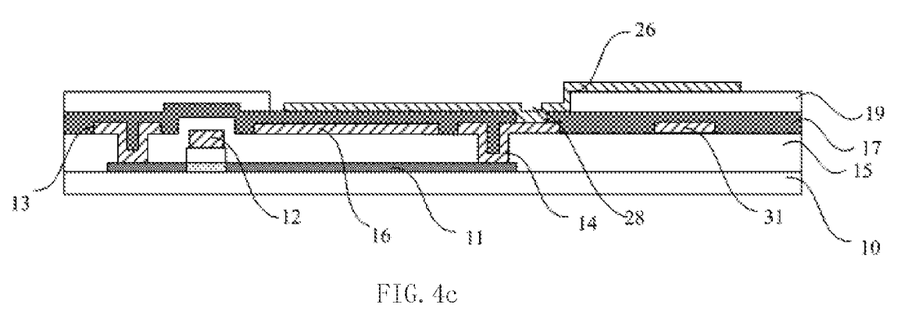

Referring to FIG. 3 and FIG. 4c, in step S03, an auxiliary conductive structure 26 is formed on the insulating layer 17, and the auxiliary conductive structure 26 is connected to the drain 14 through the first via hole 28.

In some embodiments, as shown in FIG. 4c, the auxiliary conductive structure 26 is formed on the insulating layer 17 and the second planarization layer 19 such that the auxiliary conductive structure 26 is connected to the drain 14 through the first via hole 28 in the insulating layer 17. A portion of the auxiliary conductive structure 26 is disposed on an upper surface of the insulating layer 17, an orthographic projection of the portion of the auxiliary conductive structure 26 on the substrate 10 overlaps with an orthographic projection of the electrode layer 16 on the substrate 10 to form a capacitor, and the remaining portion of the auxiliary conductive structure 26 is disposed on the upper surface of the second planarization layer 19.

Figure 4D:
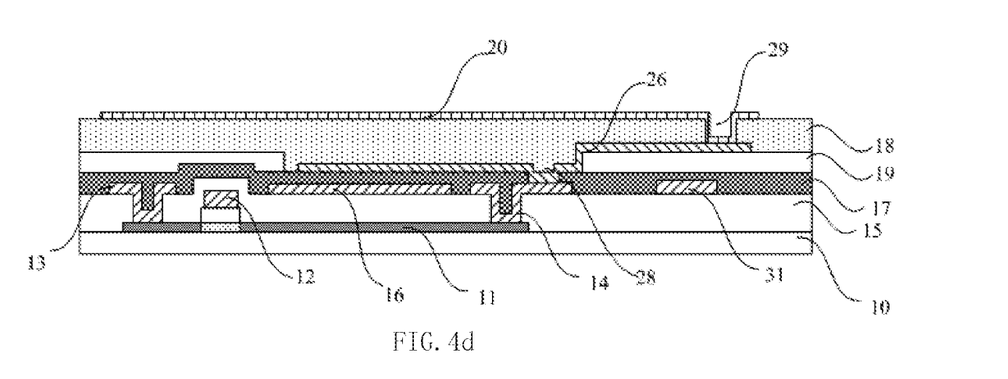

Referring to FIG. 3 and FIG. 4d, in step S04, a first planarization layer 18 is formed on the auxiliary conductive structure 26, and a second via hole 29 is disposed in the first planarization layer 18.

As shown in FIG. 4d, in some embodiments, the first planarization layer 18 is formed on the auxiliary conductive structure 26 and exposed upper surfaces of other structures such that the first planarization layer 18 covers all of the exposed structural layers including the auxiliary conductive structures 26. Then, a second via hole 29 is formed in the first planarization layer 18 according to a predetermined pattern such that the auxiliary conductive structure 26 on the second planarization layer 19 is exposed.

Figure 4E:
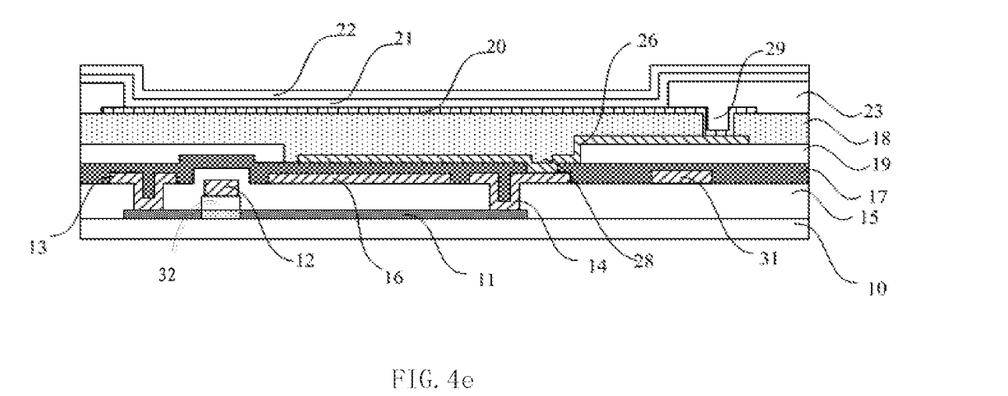

Referring to FIG. 3 and FIG. 4e, in step S05, an organic light emitting diode is formed on the first planarization layer 18, and the organic light emitting diode is connected to the auxiliary conductive structure 26 through the second via hole 29.

As shown in FIG. 4e, in some embodiments, a reflective conductive layer 20 is formed on the first planarization layer 18 and at the second via hole 29 such that the reflective conductive layer 20 is connected to the auxiliary conductive structure 26 through the second via hole 29.

In some embodiments, a pixel defining layer 23 is formed on the first planarization layer 18 and the reflective conductive layer 20, and a portion of the pixel defining layer 23 corresponding to a light emitting region 27 is removed according to a predetermined pattern such that the reflective conductive layer 20 in the light emitting region 27 is exposed to form a first electrode (e.g., an anode). The pixel defining layer 23 is used for separating the light emitting regions 27 of adjacent sub-pixels of the organic light emitting display substrate from each other. Then, an organic light emitting layer 21 is formed on the first electrode and a portion of the pixel defining layer 23, and a second electrode 22 (e.g., a cathode) is formed on the organic light emitting layer 21 such that the organic light emitting layer 21 separates the first electrode and the second electrode 22 from each other to form the organic light emitting diode.

In some embodiments, the gate 12, the source 13, the drain 14, the auxiliary conductive structure 26, the first electrode and the second electrode 22 may be formed of a common metal material (e.g., Ag, Cu, Al, Mo, etc.), a multilayer metal (e.g., MoNb/Cu/MoNb, etc.), an alloy material (e.g., AlNd, MoNb, etc.), a stacked structure (e.g., ITO/Ag/ITO, etc.) formed of a metal and a transparent conductive oxide (e.g., ITO, AZO, etc.). In some embodiments, materials of the interlayer dielectric layer 15 and the insulating layer 17 include, but are not limited to, dielectric materials such as $SiO_x$, $SiN_x$, SiON, various new organic insulating materials, high dielectric constant (High k) materials (e.g., $AlO_x$, $HfO_x$, $TaO_x$, etc.).

In some embodiments, the reflective conductive layer 20 is formed of a conductive and reflective material, such as a stack of a transparent conductive material which is used as the anode of the organic light emitting diode and a metallic material. The organic light emitting display substrate fabricated according to the method of the present disclosure is a top emission type organic light emitting display substrate, that is, light is directly emitted from a side of the organic light emitting diode away from the substrate 10 without passing through the substrate 10.

In another aspect, the present disclosure provides an organic light emitting display device including an organic light emitting display substrate as described herein or fabricated by a method described herein. In some embodiments, the organic light emitting display device includes an organic light emitting display panel. In some embodiments, the organic light emitting display panel includes an organic light emitting display substrate as described herein or fabricated by a method described herein, and a counter substrate. The organic light emitting display devices include, but are not limited to, mobile phones, tablets, televisions, displays, notebook computers, advertising screens, and any product or component having a display function.

According to a fabricating method of an organic light emitting display substrate of the present disclosure, the second via hole 29 connected to the organic light emitting diode is disposed at a position away from the first via hole 28 connected to the driving transistor through the auxiliary conductive structure 26, so that the light emitting region 27 may cover the driving transistor and the first via hole 28. In this way, the area of the light emitting region 27 of the organic light emitting display substrate can be increased, that is, a ratio of the area of the light emitting region 27 to the area of the entire organic light emitting display substrate can be increased, thereby enhancing the brightness of the organic light emitting display device and improving the performance of the organic light emitting display substrate.

It is to be understood that the above description is only for the purpose of illustrating the principles of the present disclosure, but the disclosure is not limited thereto. Various modifications and improvements can be made by those skilled in the art without departing from the spirit and scope of the disclosure, and such modifications and improvements are also considered to be within the scope of the disclosure.

What is claimed is:

1. A display substrate, comprising:
   a substrate;
   at least one pixel on a side of the substrate, the at least one pixel comprising a driving transistor, the driving transistor comprising a drain;
   a lead on a same layer as the drain;
   an insulating layer on a side of the driving transistor away from the substrate, the insulating layer covering the driving transistor and the lead and having a first via hole opposite to the drain;
   an auxiliary conductive structure on a side of the insulating layer away from the substrate, and the auxiliary conductive structure connected to the drain through the first via hole; and
   a first planarization layer on a side of the auxiliary conductive structure away from the substrate, and having a second via hole disposed therein;
   wherein the at least one pixel comprises a light emitting region and a non-light emitting region surrounding the light emitting region;
   the driving transistor and the first via hole are in the light emitting region, and the second via hole is in the non-light emitting region,
   wherein the display substrate further comprises a first electrode on a side of the first planarization layer away from the substrate and in the light emitting region, the first electrode being connected to the auxiliary conductive structure through the second via hole, and
   wherein the lead is provided between the first via hole and the second via hole.

2. The display substrate of claim 1, wherein the first electrode is a reflective conductive layer.

3. The display substrate of claim 1, wherein an orthographic projection of the auxiliary conductive structure on the substrate overlaps with an orthographic projection of the first via hole and the second via hole on the substrate.

4. The display substrate of claim 3, further comprising:
a second planarization layer between the auxiliary conductive structure and the insulating layer.

5. The display substrate of claim 4, further comprising:
an electrode layer in a same layer as a source of the driving transistor and the drain and covered by the insulating layer, the electrode layer being connected to a gate of the driving transistor,
wherein an orthographic projection of the auxiliary conductive structure on the substrate at least partially overlaps with an orthographic projection of the electrode layer on the substrate to form a first capacitor.

6. The display substrate of claim 5, wherein
an active layer of the driving transistor comprises a non-conductor region and a conductor region,
wherein an orthographic projection of the non-conductor region on the substrate overlaps with an orthographic projection of the gate on the substrate, the drain is connected to the conductor region, and an orthographic projection of the conductor region on the substrate at least partially overlaps with the orthographic projection of the electrode layer on the substrate to form a second capacitor.

7. The display substrate of claim 6, wherein
the gate is disposed on a side of the active layer away from the substrate, and
a gate insulating layer is disposed between the gate and the active layer.

8. The display substrate of claim 7, further comprising:
a pixel defining layer on the reflective conductive layer,
wherein the light emitting region is defined by an opening of the pixel defining layer.

9. A display device comprising the display substrate of claim 1.

10. The display device of claim 9, wherein the display substrate further comprises:
a second planarization layer between the auxiliary conductive structure and the insulating layer.

11. The display device of claim 10, wherein the display substrate further comprises:
an electrode layer in a same layer as the source and the drain and covered by the insulating layer, and the electrode layer being connected to a gate of the driving transistor,
wherein an orthographic projection of the auxiliary conductive structure on the substrate at least partially overlaps with an orthographic projection of the electrode layer on the substrate to form a first capacitor.

12. The display device of claim 11, wherein
an active layer of the driving transistor comprises a non-conductor region and a conductor region,
wherein an orthographic projection of the non-conductor region on the substrate overlaps with an orthographic projection of the gate on the substrate, the source and the drain are respectively connected to the conductor region, and an orthographic projection of the conductor region on the substrate at least partially overlaps with the orthographic projection of the electrode layer on the substrate to form a second capacitor.

13. The display device of claim 12, further comprising:
a pixel defining layer on the reflective conductive layer,
wherein the light emitting region is defined by an opening of the pixel defining layer.

14. A method of fabricating a display substrate, comprising:
forming a source and a drain of a driving transistor as well as a lead;
forming an insulating layer on the source and the drain, the insulating layer covering the source and the drain as well as the lead and having a first via hole disposed therein;
forming an auxiliary conductive structure on the insulating layer, the auxiliary conductive structure being connected to the drain through the first via hole;
forming a first planarization layer on the auxiliary conductive structure, the first planarization layer having a second via hole disposed therein; and
forming a light emitting diode on the first planarization layer, the light emitting diode being connected to the auxiliary conductive structure through the second via hole,
wherein forming the light emitting diode comprises forming a first electrode on the first planarization layer, the first electrode being connected to the auxiliary conductive structure through the second via hole, and
wherein the lead is provided between the first via hole and the second via hole.

15. The method of claim 14, wherein forming the light emitting diode further comprises:
forming a pixel defining layer on the reflective conductive layer;
forming an opening in the pixel defining layer, the opening corresponding to a light emitting region; and
forming a light emitting layer and a second electrode sequentially on the first electrode at the opening.

16. The method of claim 15, further comprising:
forming a second planarization layer on the insulating layer.

17. The method of claim 16, further comprising:
forming an electrode layer and a gate of the driving transistor,
wherein the electrode layer is formed in a same layer as the source and the drain, and the electrode layer is connected to the gate.

18. The method of claim 17, further comprising:
forming an active layer on the substrate before forming the source and the drain,
wherein the active layer comprises a non-conductor region and a conductor region, an orthographic projection of the non-conductor region on the substrate overlaps with an orthographic projection of the gate on the substrate, and the source and the drain are respectively connected to the conductor region.

* * * * *